United States Patent [19]

Suehrcke et al.

[11] Patent Number: 5,823,800
[45] Date of Patent: Oct. 20, 1998

[54] PRINTED CIRCUIT BOARD SOCKET

[75] Inventors: Harry Suehrcke, Cranbrook; Noel Wilhelmus Lovisa, Mundingburra, both of Australia

[73] Assignee: James Cook University of North Queensland, Queensland, Australia

[21] Appl. No.: 737,988

[22] PCT Filed: May 25, 1995

[86] PCT No.: PCT/AU95/00301

§ 371 Date: Nov. 25, 1996

§ 102(e) Date: Nov. 25, 1996

[87] PCT Pub. No.: WO95/32605

PCT Pub. Date: Nov. 30, 1995

[30] Foreign Application Priority Data

May 25, 1994 [AU] Australia ................. PM5835

[51] Int. Cl.⁶ .................................................. H01R 9/09
[52] U.S. Cl. .................................................. 439/82
[58] Field of Search .......................... 439/55, 82, 85, 439/931

[56] References Cited

U.S. PATENT DOCUMENTS 2,958,064 10/1960 Swengel ........................ 439/85

*Primary Examiner*—Neil Abrams
*Assistant Examiner*—T. C. Patel
*Attorney, Agent, or Firm*—Renner, Otto, Boisselle & Sklar, P.L.L.

[57] ABSTRACT

An electrical socket is formed in a printed circuit board (PCR) using standard automated PCB production techniques. The socket (20) comprises a respective three legged slotted aperture (22) for each pin (11) of a male plug. The slotted aperture (22) defines two cantilevered portions (23) which receive a respective pin (11) in A slot defined therebetween. The slot is of slightly narrower width than the corresponding pin (11), but the cantilevered portions (23) are resiliently movable to enable the slot to receive and frictionally retain the pin therein. Plated contact surfaces are formed on either side of the slot to make physical and electrical contact with the pin. A modified socket (40) includes an integrally formed isolation switch. The cantilevered portions (41) extend beyond the point where the pin (11) is inserted therebetween. The distal ends of the cantilevered portions (41) are provided with respective contact surfaces (43, 44) which are normally spaced apart, but come into contact to close the switch when the cantilevered portions (41) are splayed apart by the insertion of a pin therebetween. Alternatively, contacts (32) on the cantilevered portions may be arranged to come into contact with corresponding contacts (33) on the circuit board.

12 Claims, 4 Drawing Sheets

5,823,800

PRINTED CIRCUIT BOARD SOCKET

BACKGROUND ART

It is known to provide a set of apertures on a printed circuit board to serve as an electrical socket. The inside of each aperture is coated with metal and is connected electrically to a respective conductor on the board. However, such known socket arrangements are suitable only for small, low power, devices or fittings, such as IC chips, discrete transistors and the like. Furthermore, such devices are normally inserted permanently into the socket apertures by soldering.

In order to provide a removable connection facility between a standard 240 volt three pin plug and a circuit board, a conventional general purpose outlet (GPO) socket is normally used. The wires from the GPO socket are soldered to the printed circuit board (PCB). The plug is then able to be connected electrically to the PCB via the GPO socket. However, such a construction requires additional manufacturing time and cost, and the bulky socket permanently connected to the PCB interferes with the mounting of the PCB, or is otherwise an unwanted appendage.

It is also known to construct a conventional GPO socket on a pre-formed PCB, using separate metal terminals. However, the known PCB-mounted socket is relatively expensive to manufacture due to its intricately formed components and their associated assembly costs.

It is an object of the present invention to provide a printed circuit board socket which overcomes or ameliorates the abovedescribed disadvantages.

It is a preferred object of this invention to provide a circuit board socket having an isolation switch.

SUMMARY OF THE INVENTION

In one broad form, the present invention provides an electrical socket on a board, comprising at least one aperture in the board, at least a portion of the board defining an edge of the aperture being resiliently moveable to enable the aperture to receive and frictionally retain therein a pin member.

The board is typically a printed circuit board.

In a preferred embodiment, the circuit board comprises a pair of cantilevered portions defining a slot therebetween. The portions splay outwardly to receive the pin when the pin is inserted in the slot. The inherent resiliency of the circuit board material causes the two cantilevered portions to grasp and frictionally retain the pin between them. Yet, the pin can be removed by applying sufficient manual force.

Suitably, the edges of the cantilevered portions adjacent the slot are bevelled to facilitate the entry of the pin into the slot.

Preferably, the slot defined between the edges of the cantilevered portions is of tapered width.

The inside opposing edges of the cantilevered portions at the slot are coated with a suitable metal coating to provide contact terminals for the pin. The contact terminals are normally connected to conductors on the board, thereby providing secure electrical connection between the pin and the board circuitry.

The socket is designed to receive an associated (male) plug. Each aperture of the socket is shaped, positioned and orientated to correspond to its respective pin on the plug.

The socket of this invention can be manufactured as an integrated part of the circuit board using automated PCB techniques, yet still meet prescribed standards relating to electrical connections. Manufacturing time and costs are therefore reduced considerably.

In a further form of the invention, the electrical socket is provided with an associated switch, which may suitably function an isolation switch. In this form of the invention, the portion of the board which is resiliently moveable has a contact terminal thereon such that when that portion moves outwardly to accommodate the pin member in the aperture, the terminal makes contact with an adjacent associated terminal to form a switch connection.

In one preferred embodiment, the aperture is defined by two cantilevered portions of the circuit board. A contact terminal is provided on at least one of the cantilevered portions, and an associated terminal is provided on an adjacent portion of the circuit board. When a pin is inserted in the aperture formed between the cantilevered portions, the splaying of the portions causes electrical contact to be made between a pair of contact terminals.

Typically, a contact terminal is located at the distal end of each cantilevered portion, and the aperture is located between that end and the base of each cantilevered portion. In this manner, the outward splaying movement of the cantilevered portions at the aperture is amplified at their distal ends.

In order that the invention may be more fully understood and put into practice, preferred embodiments of the invention will now be described by way of example, with reference to the accompanying drawings.

DETAILED DESCRIPTION OF PREFERRED EMBODIMENTS

Figure 1:
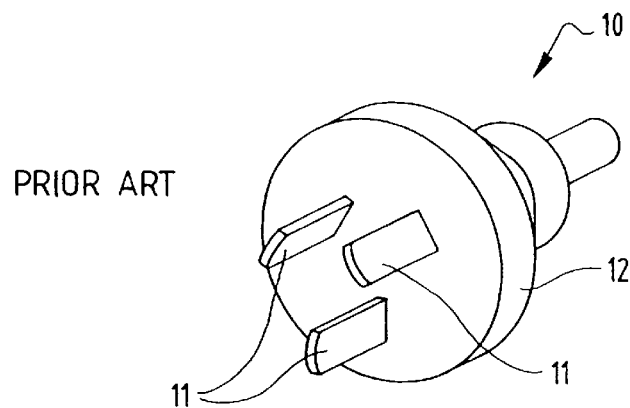
FIG. 1 is a perspective view of a conventional three pin plug.

FIG. 1 illustrates a conventional male plug 10 ("the GPO plug") suitable for insertion into a general purpose outlet (GPO) socket. The plug 10 comprises three flat metal prongs or pins 11 protruding from an insulating body 12. The pins 11 are connected to respective wires in the insulating body 12, which extend from an electrical cord connected to the body. Typically, three pins are provided, namely an active pin, a neutral pin, and an earth pin.

The three pin conventional GPO plug illustrated schematically in FIG. 1 is shown by way of example only. Although the following embodiments will be described with particular reference to their use with the GPO plug illustrated in FIG. 1, this invention is not limited to use with such plugs. For example, the sockets of this invention may be used with plugs having any suitable number of pins, including single pin plugs. Furthermore, the pins may be of any suitable cross sectional shape, such as rectangular (as shown) and circular.

Figure 2:
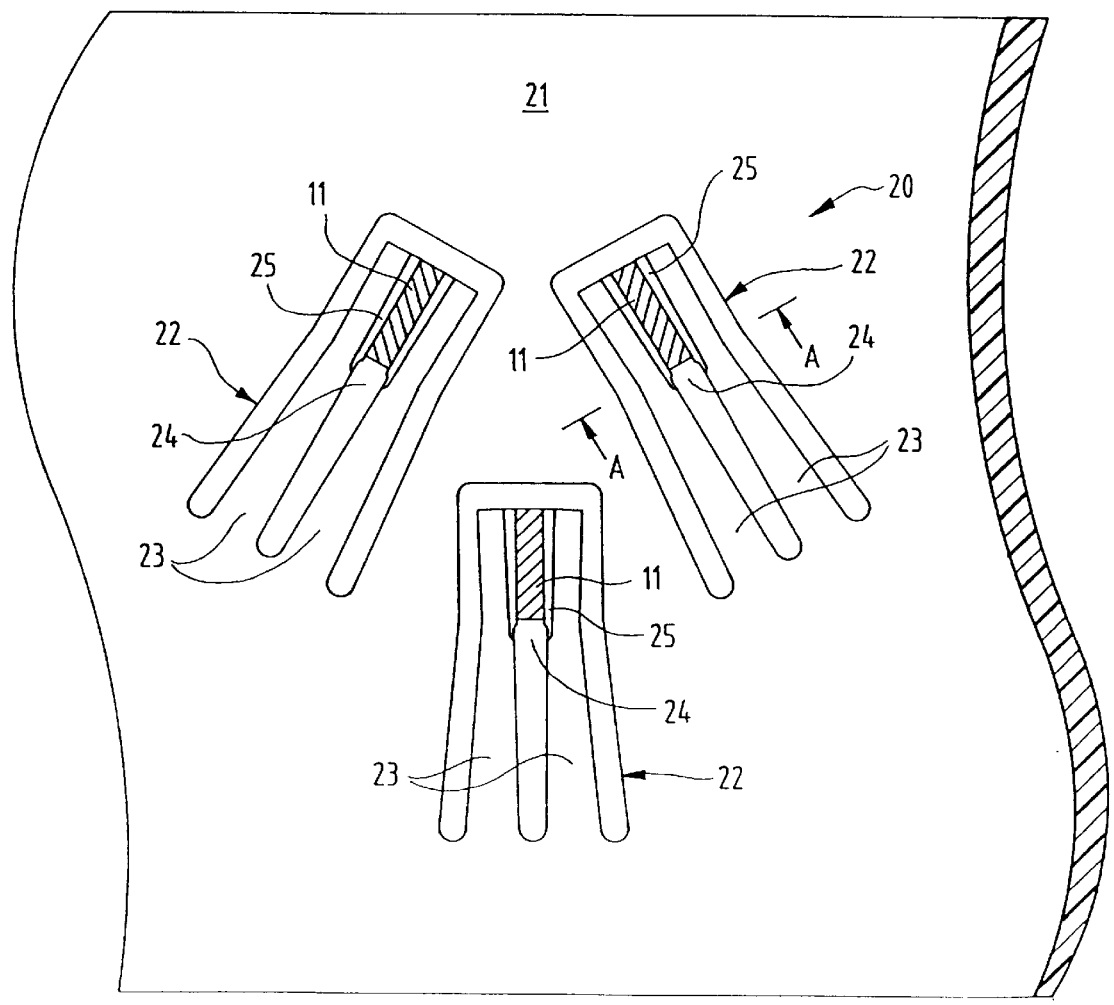
FIG. 2 is a fragmentary plan view of a printed circuit board socket according to one embodiment of the invention.

As shown in FIG. 2, a socket 20 is formed in a printed circuit board 21 by a set of slotted apertures 22. The apertures may be formed in the board by any suitable technique, e.g. milling, drilling, routing, punching, etching, etc. The apertures 22 are formed before the conductors and other electrical components are applied to the board 21 in the PCB fabrication process.

Each slotted aperture 22 is preferably of three-legged configuration to form a pair of cantilevered portions 23 of the circuit board, defining a slot 24 therebetween.

Preferably, the width of the slot 24 tapers slightly inwardly towards its open end. Ideally, the taper is such that when the pin is inserted in the slot and the cantilevered portions are splayed apart, the inside faces of the slot are parallel. This enables the pin contact area to be increased, thereby reducing wear.

The taper also facilitates entry of the pin. The width of the slot 24 is slightly less than the thickness of its associated pin 11 of the male plug 10.

Figure 3:
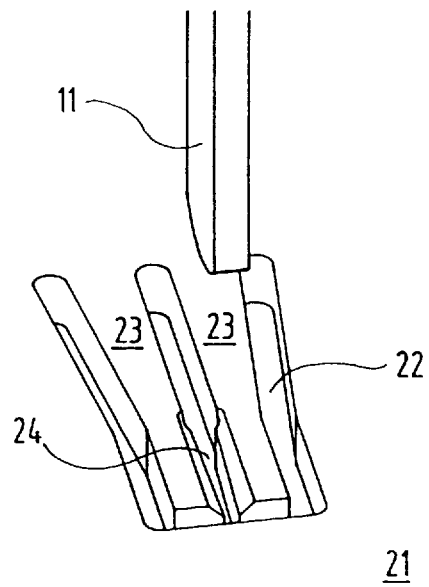
FIG. 3 is an oblique view of part of the socket of FIG. 2.
Figure 4:
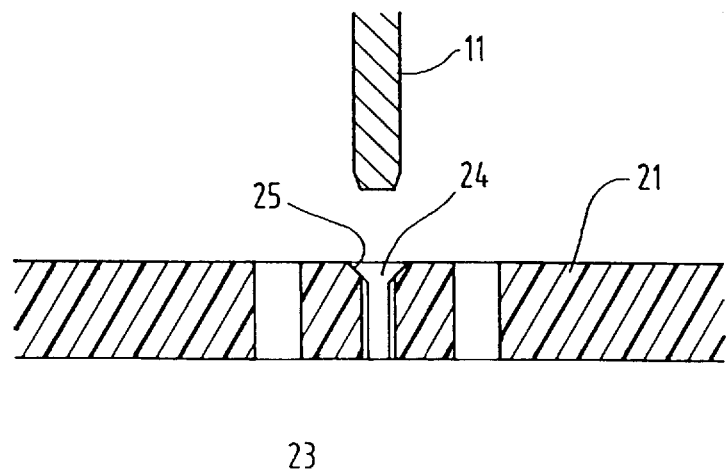
FIG. 4 is a sectional view along A—A of FIG. 2.

As shown in FIGS. 2–4, when a pin 11 of GPO plug 10 is inserted into its corresponding slot 24, the cantilevered portions 23 are forced outwardly to accommodate the pin 11 therebetween. The inherent resilient nature of the circuit board ensures that the pin 11 is frictionally held between the portions 23.

The opposing faces or surfaces of the cantilevered portions 23 which define the slot 24 are suitably plated with a conductive metal coating in the region of contact with the pin 11, using standard printed circuit manufacturing techniques. At least one of each pair of plated contacts is connected to a conductor on the board. In this manner, there is secure electrical connection between each pin 11 and the circuit on the board.

The cantilevered portions are preferred mirror images of each other, and tapered so that they form cantilevers of approximately uniform strength. This results in substantially constant stress along the length of each cantilevered portion 23, thereby maximising the elastic deflection.

The cantilevered portions 23 may suitably be provided with bevelled edges 25 to facilitate the insertion of the associated pin 11 of the GPO plug.

The gap between the cantilevered portions 23, i.e. the width of slot 24, and the length and thickness of the cantilevered portions 23, as well as the friction coefficient of the metal coating on the opposing surfaces of the cantilevered portions 23, are chosen to meet electrical and mechanical design requirements, such as those set by AS 3112 of the Standards Association of Australia.

The sets of slotted apertures 22 are positioned and orientated on the circuit board 21 to correspond to the relative spacing and orientation of the pins 11 of the associated plug 10 so that the plug 10 may only be inserted in the socket 20 in its correct manner, as shown in FIG. 2.

Figure 5:
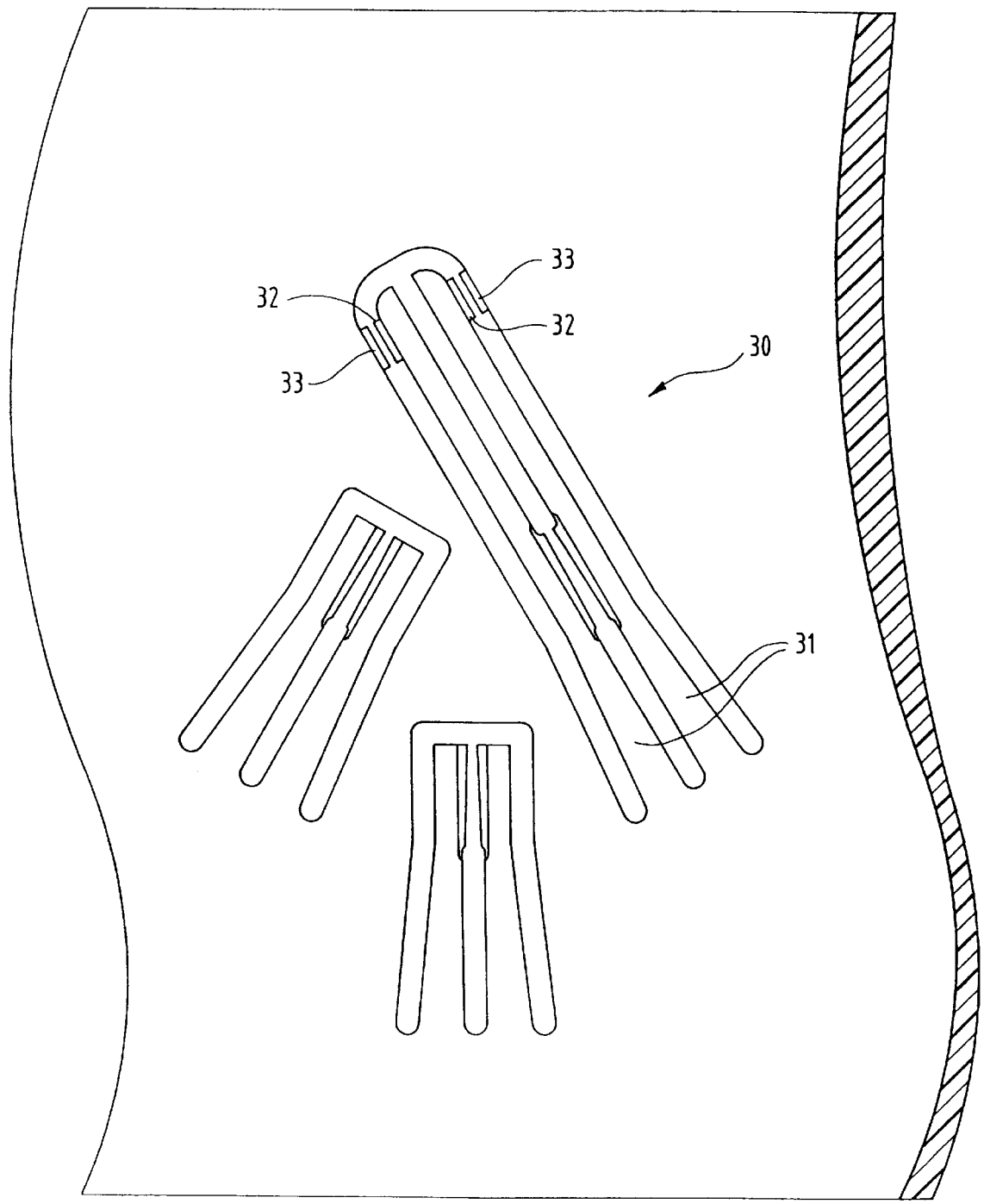
FIG. 5 is a fragmentary plan view of a printed circuit board socket with isolation switch according to another embodiment of the invention.

In another embodiment of the invention, illustrated in FIG. 5, a printed circuit board socket 30 is provided with an isolation switch. The socket 30 is similar to the socket of FIG. 2, except that one set of cantilevered portions 31, which define a slot therebetween, extend beyond the point where a pin 11 is inserted between them. Each cantilevered portion 31 has a metal contact on its outside edge at the distal end thereof, opposite a corresponding contact 33 on the slotted edge of the main circuit board 34.

Again, the slot between cantilevered portions 31 is of narrower width than its associated pin 11. When the pin 11 is inserted in the slot, the cantilevered portions 31 are splayed outwardly such that at least one associated pair of contacts 32, 33 make physical, and hence electrical, connection thereby triggering an isolation switch.

The above described construction satisfies the requirements of clause 4.14.6 of AS 3000 relating to integral switch-type socket-outlets.

Figure 6:
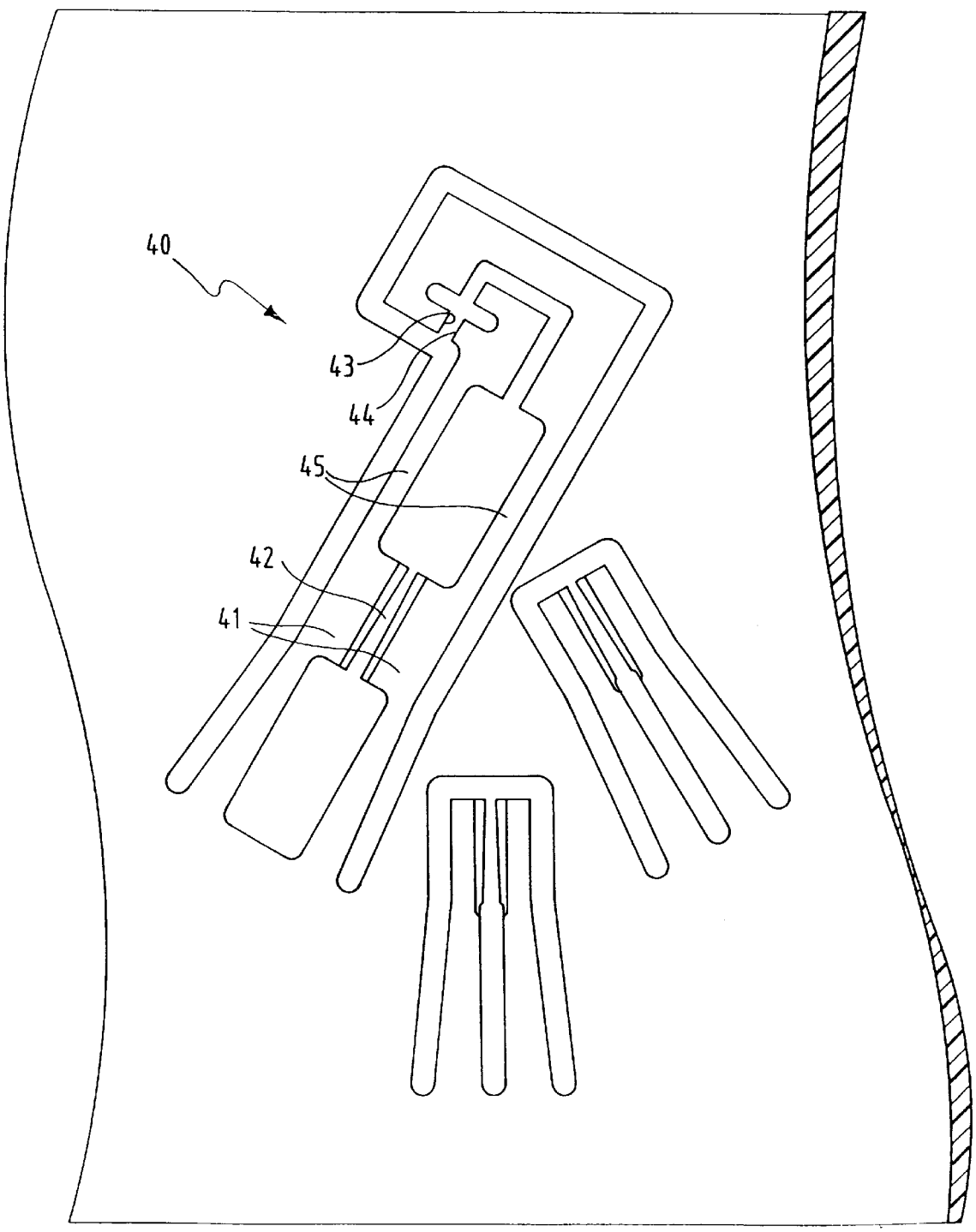
FIG. 6 is a fragmentary plan view of a printed circuit board socket with isolation switch according to yet another embodiment of the invention.

In yet another embodiment, illustrated in FIG. 6, a printed circuit board socket 40 incorporates a switch. The socket 40 is similar to the socket of FIG. 5. Two cantilevered portions 41 define a slot 42 therebetween within which a pin of a male plug is inserted. When the pin is inserted in the slot 42, the cantilevered potions 41 are splayed outwardly. The free end of one cantilevered portion extends around the top of the other and has a portion 43 located opposite a portion 44 on the outer side of the other cantilevered portion. The portions 43, 44 are each coated with a conductive layer connected to a respective conductor on the board.

When the pin is inserted in slot 42, the two opposing cantilevers move in opposite directions. Since the end of one cantilevered portion overlaps the end of the other, this movement causes the metal contacts 43, 44 on the respective cantilevers to come into contact, thereby closing a switch automatically upon insertion of the male plug into the socket 40.

The construction illustrated in FIG. 6 has several advantages, including, (i) the cantilever counter movement is accumulative, allowing a much larger air gap for a given cantilever length, and (ii) pin misalignment can be accommodated since the contact closure is only dependent on the thickness of the pin inserted.

After the contact closure has occurred, further deflection caused by the insertion of the pin is elastically absorbed by one or both of the cantilevered portions 41, resulting in flattening of the contact. The cantilevered portions 41 are suitably provided with reduced neck portions 45 to enable them to absorb excess deflection.

Since all of the abovedescribed sockets are formed as slotted apertures in the printed circuit board itself, they do not add substantially to the thickness of the board.

The sockets are integrated with the PCB and can be formed and plated during the manufacture of the PCB using standard automated PCB production techniques. The sockets can therefore be produced economically, and with no significant extra assembly time. Moreover, the sockets satisfy the prescribed standards for insertion force and fault current capacity.

The foregoing describes only some embodiments of the invention, and modifications which are obvious to those skilled in the art may be made thereto without departing from the scope of the invention.

For example, the shape and configuration of the cantilevered portions, and the slots defining the cantilevered portions, can be varied to suit particular design requirements. The socket formations shown in FIGS. 2, 5 and 6 are designed to suit the three pin plug shown in FIG. 1. This plus is of the standard type commonly used in Australia. The socket formations may be varied to suit plugs used in other countries, such as the twin round pin plug used in Europe, or the twin parallel blade pin plug used in the United States.

We claim:

1. A board having at least one electrical socket formation therein for receiving a pin member, the socket formation comprising an aperture in the board, the board having an integrally formed cantilevered portion defining at least part of an edge of the aperture, the cantilevered portion being resiliently movable in the plane of the board to enable the aperture to receive therein a pin member of slightly greater diametral dimension and to frictionally retain the pin member in the aperture.

2. A board as claimed in claim 1, wherein the socket formation includes a pair of cantilevered portions of the board defining the aperture therebetween.

3. A board as claimed in claim 2, wherein each cantilevered portion of the board has a tapered width which reduces towards its free end.

4. A board as claimed in claim 2, wherein the aperture is in the form of an elongate slot.

5. A board as claimed in claim 4, wherein the slot has a tapered width which reduces towards the free ends of the cantilevered portions.

6. A board as claimed in claim 4, wherein the edges of the cantilevered portions on either side of the slot are bevelled.

7. A board as claimed in claim 1, wherein the board is a printed circuit board, the socket formation having one or more contacts connected electrically to conductors on the board during the manufacture of the printed circuit board.

8. A board as claimed in claim 1, further comprising a contact switch comprising at least one contact surface on the resiliently movable portion of the board, said contact surface coming into physical and electrical contact with another contact surface when said portion of the board is moved by the insertion of the pin member in the aperture.

9. A board as claimed in claim 8, wherein the other contact surface is located on a fixed part of the board.

10. A board as claimed in claim 8, wherein the movable portion of the board is a cantilevered portion, the contact surface being located at or adjacent to the free end of the cantilevered portion, and the aperture being located intermediate the ends of the cantilevered portion.

11. A board as claimed in claim 2, further comprising a switch having a pair of contact surfaces each located on a respective one of the cantilevered portions, wherein upon insertion of the pin member in the aperture between the cantilevered portions, the portions are caused to move to bring the contact surfaces into physical and electrical contact with each other.

12. A board as claimed in claim 11, wherein the contact surfaces are located at or adjacent to the free ends of the cantilevered portions, and the aperture is located intermediate the ends of the cantilevered portions.

* * * * *

UNITED STATES PATENT AND TRADEMARK OFFICE
CERTIFICATE OF CORRECTION

PATENT NO. : 5,823,800
DATED : October 20, 1998
INVENTOR(S) : Suehrcke, et al

It is certified that error appears in the above-identified patent and that said Letters Patent is hereby corrected as shown below:

On title page, item [56] insert the following

UNITED STATES PATENT AND TRADEMARK OFFICE
CERTIFICATE OF CORRRECTION

PATENT NO. : 5,823,800
DATED : October 20, 1998
INVENTOR(S) : Suehrcke, et al It is certified that error appears in the above-identified patent and that said Letters Patent is hereby corrected as shown below:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 3 | 8 | 7 | 4 | 7 | 5 | 9 | 04/1975 | | 439 | 525 | |

FOREIGN PATENT OR PUBLISHED FOREIGN PATENT APPLICATION

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | | 3 | 4 | 9 | 7 | 0 | 6 A | 06/1931 | GB | | | | |
| | | 1 | 1 | 9 | 5 | 0 | 9 5 A | 06/1970 | GB | | | | |
| | | 9 | 3 | 2 | 8 | 9 | 8 A | 04/1948 | FR | | | | |
| 62 - | | 1 | 5 | 8 | 3 | 8 | 9 A | 07/1987 | JP | | | | |
| | | 1 | 0 | 8 | 5 | 4 | 9 1 A | 10/1967 | GB | | | | |

Signed and Sealed this

Ninth Day of March, 1999

Attest:

Q. TODD DICKINSON

*Attesting Officer*   *Acting Commissioner of Patents and Trademarks*